United States Patent
Cotte et al.

(10) Patent No.: US 6,653,233 B2
(45) Date of Patent: Nov. 25, 2003

(54) PROCESS OF PROVIDING A SEMICONDUCTOR DEVICE WITH ELECTRICAL INTERCONNECTION CAPABILITY

(75) Inventors: John Michael Cotte, New Fairfield, CT (US); Kenneth John McCullough, Fishkill, NY (US); Wayne Martin Moreau, Wappinger, NY (US); Keith R. Pope, Danbury, CT (US); John P. Simons, Wappingers Falls, NY (US); Charles J. Taft, Wappingers Falls, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 09/893,266

(22) Filed: Jun. 27, 2001

(65) Prior Publication Data

US 2003/0003746 A1 Jan. 2, 2003

(51) Int. Cl.$^7$ ................... H01L 21/44; H01L 21/4763
(52) U.S. Cl. ................... 438/677; 438/637; 438/641; 438/687
(58) Field of Search ................ 438/694, 695, 438/696, 697, 698, 699, 700, 701, 702, 703, 692, 687, 674, 677, 626, 637

(56) References Cited

U.S. PATENT DOCUMENTS

| | | | | |
|---|---|---|---|---|
| 5,783,082 A | * | 7/1998 | DeSimone et al. | 134/1 |
| 5,908,510 A | | 6/1999 | McCullough et al. | 134/2 |
| 5,972,124 A | | 10/1999 | Sethuraman et al. | 134/7 |
| 6,010,962 A | * | 1/2000 | Liu et al. | 438/674 |
| 6,126,853 A | | 10/2000 | Kaufman et al. | 252/79.1 |
| 6,140,234 A | * | 10/2000 | Uzoh et al. | 438/670 |
| 6,277,753 B1 | * | 8/2001 | Mullee et al. | 134/1.3 |
| 6,287,968 B1 | * | 9/2001 | Yu et al. | 438/643 |
| 6,306,564 B1 | * | 10/2001 | Mullee | 430/329 |
| 2002/0119398 A1 | * | 8/2002 | DeSimone et al. | 430/315 |
| 2003/0047533 A1 | * | 3/2003 | Reid et al. | 216/24 |

OTHER PUBLICATIONS

Kirby et al., Chem Rev., 199, 565–602 (1999).

* cited by examiner

*Primary Examiner*—Erik Kielin
(74) *Attorney, Agent, or Firm*—Scully, Scott, Murphy & Presser; Daniel P. Morris, Esq.

(57) ABSTRACT

A process of providing a semiconductor device with electrical interconnection capability wherein a sacrificial material is introduced into topographical features of the semiconductor device prior to chemical mechanical polishing so that debris formed during chemical mechanical polishing is incapable of falling into topographical features present on the semiconductor device. The sacrificial material is thereupon removed by liquid or supercritical carbon dioxide.

8 Claims, 2 Drawing Sheets

PROCESS OF PROVIDING A SEMICONDUCTOR DEVICE WITH ELECTRICAL INTERCONNECTION CAPABILITY

BACKGROUND OF THE DISCLOSURE

1. Field of the Invention

The present invention is directed to a method of processing a semiconductor device having topographical features therein. More specifically, the process of the present invention is directed to providing means for electrical interconnection capability to a semiconductor device without introducing debris into topographical features resulting from such processing.

2. Background of the Prior Art

The continuing decrease in size of semiconductor devices, which include semiconductor wafers, semiconductor chips, ceramic substrates, patterned film structures and the like, have resulted in increased failure rates due to shorts and other defects in the electrical pattern disposed upon the semiconductor device.

As indicated above, it is the ever increasing miniaturization of semiconductor devices that has created these problems. Specifically, a major cause of increased electrical failures has been the inability to remove debris from topographical features due to the inability of traditional solvents from penetrating therein to remove debris that disturbs the resulting electrical conductivity on and between semiconductor devices.

The preparation of electrical interconnection of a semiconductor device requires that an electrically conductive layer be disposed in topographical features of the semiconductor device so that electrical conductivity paths can be later introduced thereon. However, as those skilled in the art are aware, the electrically conductive layer must be removed from those portions of the semiconductor device, principally the surface, where no electrical conductivity is desired. This is accomplished by chemical mechanical polishing. However, this polishing step oftentimes results in the deposition of debris into the typographical surfaces. Indeed, a discussion of this problem is set forth in U.S. Pat. No. 6,126,853.

In the prior art, the removal of unwanted conductive material after formation of seed layers and other such materials by chemical mechanical processing, which resulted in the deposition of debris into topographical features, was accomplished by utilizing wet chemical cleaning processes of the type set forth in U.S. Pat. No. 5,972,124. Unfortunately, as semiconductor devices have become smaller and smaller, even reaching the nanometer size, the ability of conventional cleaning solvents to penetrate into such topographical features has markedly diminished. As such, prior art processes are incapable of providing satisfactory processing of the most recently developed semiconductor devices to provide those devices with electrical interconnection capability. There is therefore a strong need in the art for a new process of providing electrical interconnection of semiconductor devices.

BRIEF SUMMARY OF THE INVENTION

A new process has now been developed which permits electrical interconnection of semiconductor devices even when the semiconductor devices themselves are of such small size and possessed of such high aspect ratios that conventional cleaning materials cannot penetrate into topographical features thereon.

In accordance with the present invention a process of providing a semiconductor device, having topographical features with electrical interconnection capability, is provided. In this process an electrically conductive seed layer is deposited thereon. This is followed by the deposition of a layer of a sacrificial material which is soluble in liquid or supercritical carbon dioxide. The semiconductor device is thereupon polished with a chemical mechanical polish to remove the unwanted seed layer material and the sacrificial material from all but the topographical features of the semiconductor device. The sacrificial material is then removed from the topographical features of the semiconductor device by contacting the device with liquid or supercritical carbon dioxide.

BRIEF DESCRIPTION OF THE DRAWINGS

The present invention will be better understood by reference to the accompanying drawings of which.

DETAILED DESCRIPTION

Figure 1:
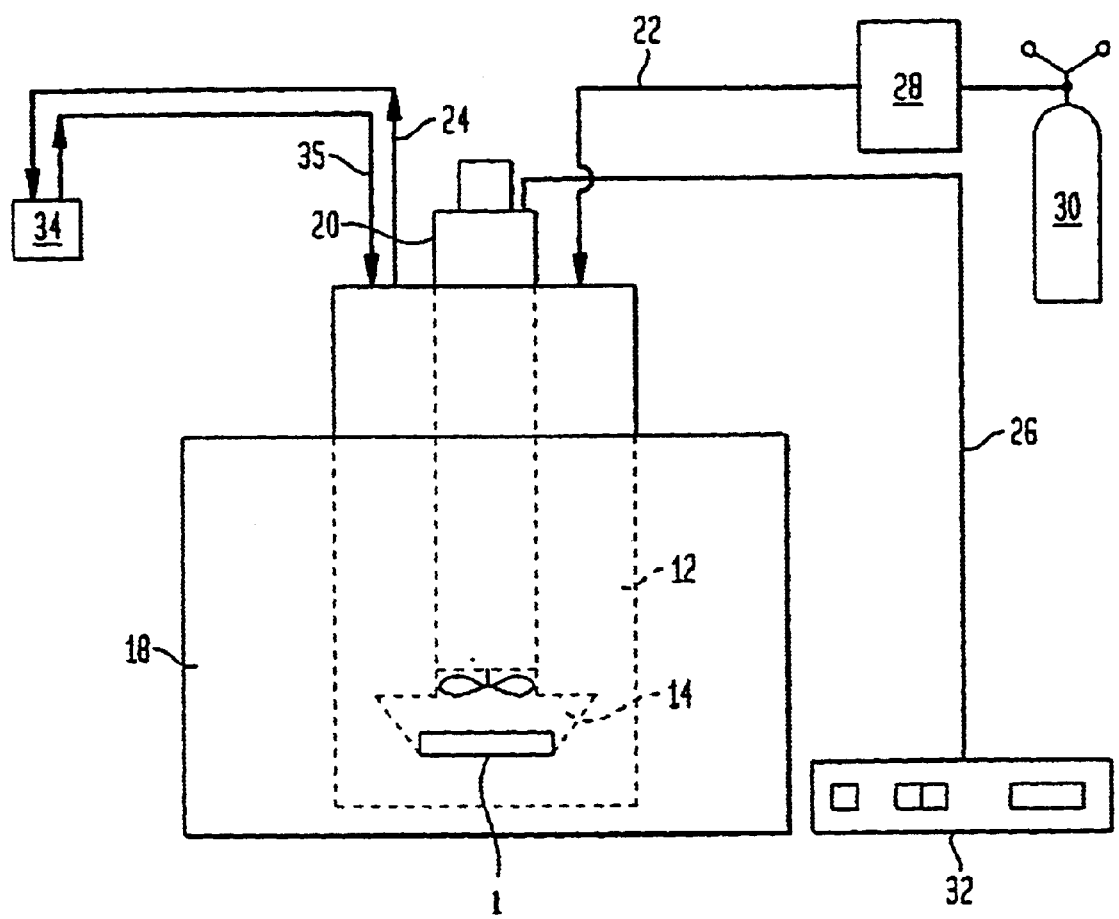
FIG. 1 is a schematic representation of an apparatus for removing a sacrificial material from a semiconductor device.

Semiconductor devices, which include semiconductor wafers, semiconductor chips, ceramic substrates, patterned film structures and the like, are provided with topographical features in order to provide electrical conductivity in and among such devices. The topographical features are employed to provide conduits into which electrically conductive materials, usually metals, can be disposed to provide electrical conductivity. Those skilled in the art are aware that metal or other electrically conductive seed layers provide an excellent foundation upon which an electrically conductive metal may be plated or otherwise introduced. Indeed, the recent growth in importance of electroless plating, which results in the deposition of metals into topographical features such as vias, trenches, indentations and the like is evidence of this observation. The subsequent removal of deposited material from planar and other surfaces, upon which electrical conductivity is undesired, however, has been the source, in the prior art, of problems insofar as their removal has led to debris falling into topographical features causing electrical failures of the semiconductor device. The process of the present invention overcomes this serious defect in prior art processing.

The process of the present invention is best understood by reference to FIGS. 2 through 5. In these figures a semiconductor device, designated by reference numeral 1, is provided. The device 1, which is constructed of a semiconductor material 2, e.g. silicon, is provided with a topographical feature. That is, the device 1 includes a trench 5.

Figure 2:
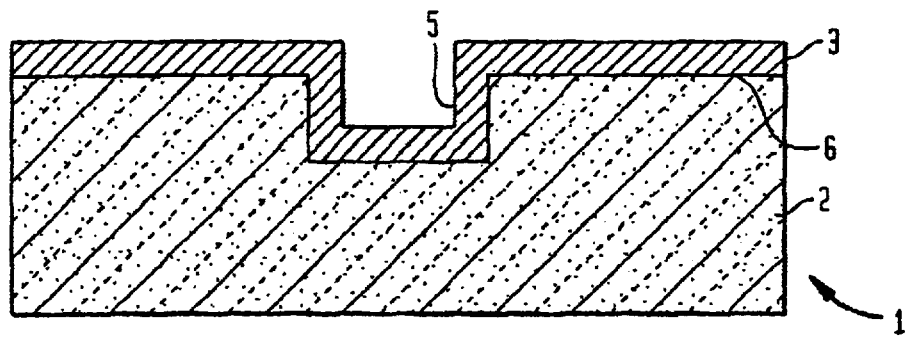
FIG. 2 is a cross-sectional representation of a semiconductor device having topographical features which are covered with an electrically conductive seed layer of a conductive material.

In a first step the semiconductor material 2 of device 1 is coated with a seed layer 3 of an electrically conductive material, usually a metal. As shown in FIG. 2, the seed layer 3, whose purpose is to cover topographical features, not only forms a layer on topographical features of device 1, e.g. trench 5, but, in addition, covers non-topographical portions, such as surface 6, of device 1. It is the removal of seed layer 3 from non-topographical features that requires that this layer be subjected to chemical mechanical polishing.

In order to overcome problems associated in the prior art with debris falling into trench 5 during chemical mechanical polishing, in which surface 6 is planarized, the next step in the process of the present invention is filling topographical features with a sacrificial material 4. Sacrificial material 4 is limited by the requirement that it be soluble in liquid or supercritical carbon dioxide. In a preferred embodiment the sacrificial material 4 is insoluble in aqueous media. More preferably, the sacrificial material 4 is a perfluoroacrylate, a paraffin wax, nylon, polybutene, polydimethylsiloxane, copolymers of dimethyl siloxane and methyl methacrylate and mixtures thereof.

Figure 3:
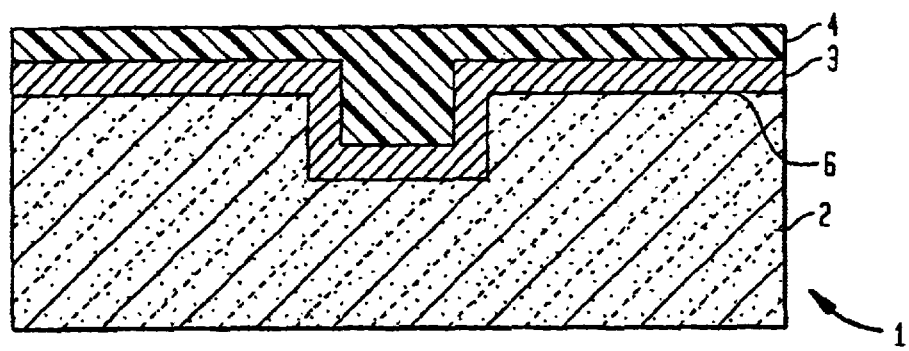
FIG. 3 is a cross-sectional representation of the semiconductor device of FIG. 2 in which a sacrificial material is deposited thereon.
Figure 4:
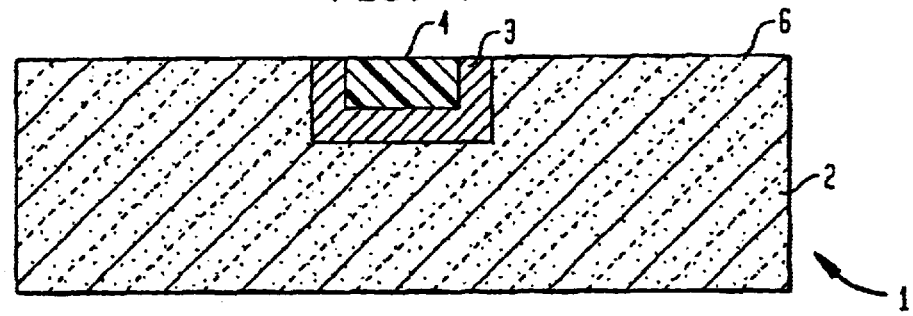
FIG. 4 is a cross-sectional representation of the semiconductor device of FIG. 3 subsequent to chemical mechanical polishing.

FIG. 3 illustrates the semiconductor device 1 upon completion of the deposition of the sacrificial material 4. The device 1 is thereupon planarized to remove the seed layer 3 disposed upon surface 6 of device 1. This is accomplished by standard chemical mechanical polish processing, the method of which is well known in the art. In the course of this planarizing step the sacrificial material 4, disposed on surface 6, is also removed. However, in addition to the desirable retention of the seed layer in trench 5, the sacrificial material 4 also remains therein, as depicted in FIG. 4.

Figure 5:
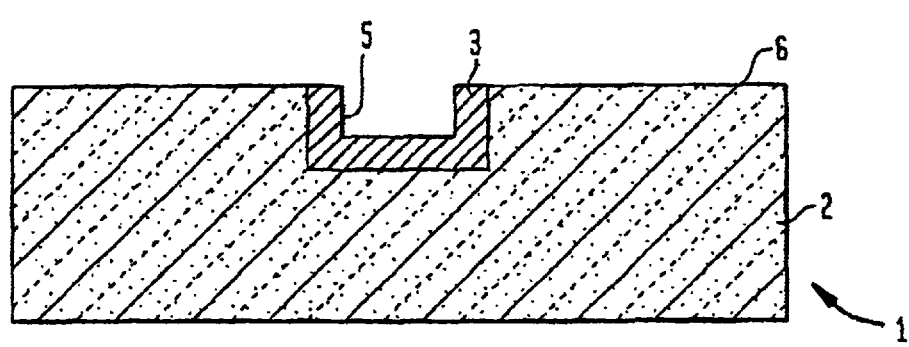
FIG. 5 is a cross-sectional representation of the semiconductor device of FIG. 4 subsequent to contact with liquid or supercritical carbon dioxide.

Although it is the retention of sacrificial material 4 in trench 5 that ensures that no debris, which is produced in the planarizing step, can deposit therein, the sacrificial material must be removed without disturbing the seed layer 3. Thus, in a subsequent step, the sacrificial material 4 is removed by contact with liquid or supercritical carbon dioxide. The result of this step is depicted in FIG. 5. FIG. 5 illustrates the semiconductor device 1 with a seed layer 3 disposed in trench 5, free of any debris.

In an optional final step of the process of the present invention, electrical conductivity in the semiconductor device 1 is provided by disposing, such as by plating, an electrical conductive material, preferably an electrically conductive metal, of which copper is preferred, in the topographical features in which the electrically conductive seed layer 3 is disposed.

The step of contacting semiconductor device 1 with liquid or supercritical carbon dioxide requires an apparatus that permits retention of the carbon dioxide in the liquid or supercritical state during contact of the device 1 with liquid or supercritical carbon dioxide. Such a suitable apparatus is illustrated in FIG. 1. The apparatus includes a process chamber 12 which includes a sacrificial material removal zone 14 wherein a semiconductor device 1 is disposed. The process chamber 12 is surrounded by heated jacket 18 and contains, optionally, a stirring mechanism 20. Additionally, the chamber 12 contains inlet line 22, outduct 24 and thermocouple 26. The inlet line 22 contains a high pressure pump system 28 which is connected to a carbon dioxide source 30 for supplying liquid or supercritical carbon dioxide to process chamber 12. Thermocouple 26 is also connected to heat controller 32 which controls and monitors the temperature of the sacrificial material removal zone 14. A reservoir 34 may also be provided for collecting and purifying liquid or supercritical carbon dioxide that may exit process chamber 12 through outduct 24. This carbon dioxide may then be recycled into process chamber 12 through duct 35 to form a closed system.

The carbon dioxide source 30 contains pressurized carbon dioxide. Indeed, as stated above, and as shown in FIG. 1, the carbon dioxide is further pressurized by high pressure pump 28. Typically, the liquid or supercritical carbon dioxide is prepressurized to a pressure in the range of between about 1,000 psi and about 6,000 psi. More preferably, the carbon dioxide is prepressurized to a pressure in the range of between about 2,000 psi and about 5,000 psi. Even more preferably, the carbon dioxide is pressurized to a pressure of about 3,000 psi before entering process chamber 12 through inlet conduit 22.

The processing step of sacrificial material removal is conducted in accordance with the thermodynamic conditions extant in processing chamber 12. The pressure in processing chamber 12 is in the range of between about 1,000 psi and about 6,000 psi, more preferably, a pressure of between about 2,000 psi and about 5,000 psi and, most preferably, a pressure of about 3,000 psi. The temperature in processing chamber 12 is in the range of between about 40° C. and about 100° C., more preferably, a temperature in the range of between about 40° C. and about 70° C. and, most preferably, a temperature of about 40° C.

To ensure effective removal of the sacrificial material from semiconductor device 1, the device is exposed to the aforementioned thermodynamic conditions for between about 2 minutes and about 2 hours. More preferably, the time period of exposure of device 1 to liquid or supercritical carbon dioxide, under the above-identified conditions, is about 3 minutes.

Another optional feature of the sacrificial material removal step, which helps ensure uniform exposure to the carbon dioxide fluid, is providing stirring of the liquid or supercritical carbon dioxide. This is depicted in the apparatus, where stirring is provided, by stirring mechanism 20. In those cases where this optional feature is provided, stirring occurs at a rate of between about 500 rpm and about 2,500 rpm. Preferably, stirring occurs at a rate of about 1,000 rpm.

The above embodiments are given to illustrate the scope and spirit of the present invention. These embodiments will make apparent, to those skilled in the art, other embodiments and examples. These other embodiment and examples are within the contemplation of the present invention. Therefore the present invention should be limited only by the appended claims.

What is claimed is:

1. A process of providing a semiconductor device with electrical interconnection capability comprising the steps of:

(a) depositing an electrically conductive seed layer on a semiconductor device provided with topographical features;

(b) depositing a sacrificial material selected from the group consisting of perfluoroacrylate, a paraffin wax, nylon, polybutene, polydimethylsiloxane, copolymers of dimethyl siloxane and methyl methacrylate and mixtures thereof, soluble in liquid or supercritical carbon dioxide, on said semiconductor device, (c) polishing the surface of said semiconductor device with a chemical mechanical polish wherein said seed layer and said sacrificial material is removed from all but topographical features of said semiconductor device and;

(d) contacting said semiconductor device with a material selected from the group consisting of liquid carbon dioxide and supercritical carbon dioxide wherein said sacrificial material is removed from said topographical of said semiconductor device.

2. A process in accordance with claim 1 including the step, subsequent to step (d), of (e) introducing a conducting material into said topographical features covered with said electrically conductive seed layer.

3. A process in accordance with claim 1 wherein said topographical features are selected from the group consisting of vias, trenches, indentations, channels and combinations thereof.

4. A process in accordance with claim 1 wherein said sacrificial material is insoluble in aqueous media.

5. A process in accordance with claim 1 wherein said semiconductor device provided with topographical features is nanometer-sized.

6. A process in accordance with claim 1 wherein said step (b) occurs at a pressure in the range of between about 1,000 psi and about 6,000 psi and a temperature in the range of between about 40° C. and about 100° C.

7. A process in accordance with claim 6 wherein said pressure is in the range of between about 2,000 psi and about 5,000 psi and a temperature in the range of between about 40° C. and about 70° C.

8. A process in accordance with claim 7 wherein said step (b) occurs over a period in the range of between about 2 minutes and about 2 hours.

* * * * *